United States Patent
Shin et al.

(10) Patent No.: US 11,336,266 B2
(45) Date of Patent: May 17, 2022

(54) METHOD OF OPERATING A SYSTEM INCLUDING A PARAMETER MONITORING CIRCUIT

(71) Applicant: Samsung Electronics Co., Ltd., Suwon-si (KR)

(72) Inventors: Dongho Shin, Hwaseong-si (KR); Kyungtae Kang, Seoul (KR); Junha Lee, Seoul (KR); Tongsung Kim, Seongnam-si (KR); Jangwoo Lee, Seoul (KR); Jeongdon Ihm, Seongnam-si (KR); Byunghoon Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/222,033

(22) Filed: Apr. 5, 2021

(65) Prior Publication Data

US 2021/0226613 A1     Jul. 22, 2021

Related U.S. Application Data

(62) Division of application No. 16/861,903, filed on Apr. 29, 2020, now Pat. No. 10,998,888.

(30) Foreign Application Priority Data

Sep. 11, 2019    (KR) .................. 10-2019-0113036

(51) Int. Cl.
*H03K 3/017*  (2006.01)
*H03K 19/21*  (2006.01)
*H03K 5/24*   (2006.01)

(52) U.S. Cl.
CPC ............... *H03K 3/017* (2013.01); *H03K 5/24* (2013.01); *H03K 19/21* (2013.01)

(58) Field of Classification Search
None
See application file for complete search history.

(56) References Cited

U.S. PATENT DOCUMENTS

| | | |
|---|---|---|
| 7,308,632 B1 | 12/2007 | Verma et al. |
| 7,956,660 B2 | 6/2011 | Ooshima et al. |
| 8,063,680 B2 | 11/2011 | Choi |

(Continued)

OTHER PUBLICATIONS

Notice of Allowance dated Jan. 14, 2021, issued in corresponding U.S. Appl. No. 16/861,903.

*Primary Examiner* — Jeffery S Zweizig
(74) *Attorney, Agent, or Firm* — Harness, Dickey & Pierce, P.L.C.

(57) ABSTRACT

A method of operating a system including a parameter monitoring circuit and a host, includes generating a first parameter applying a first code to a current parameter, wherein a first offset is applied to the first code; generating a first comparison result by comparing the first parameter with a reference parameter value; generating a second parameter applying a second code to the current parameter, wherein a second offset is applied to the second code; generating a second comparison result by comparing the second parameter with the reference parameter value; detecting an error in the current parameter, based on the first comparison result and the second comparison result; and providing a signal based on the error to the host.

20 Claims, 12 Drawing Sheets

(56) References Cited

U.S. PATENT DOCUMENTS

| | | |
|---|---|---|
| 8,446,199 B2 | 5/2013 | Shim et al. |
| 9,263,107 B1 | 2/2016 | Wayland et al. |
| 9,264,039 B2 * | 2/2016 | Seol .................. H03K 19/0005 |
| 9,306,547 B2 | 4/2016 | Arp et al. |
| 9,780,769 B2 | 10/2017 | Im et al. |
| 9,805,773 B1 | 10/2017 | Shi et al. |
| 2011/0248756 A1 | 10/2011 | Abe |
| 2014/0002156 A1 | 1/2014 | Dwivedi et al. |

\* cited by examiner

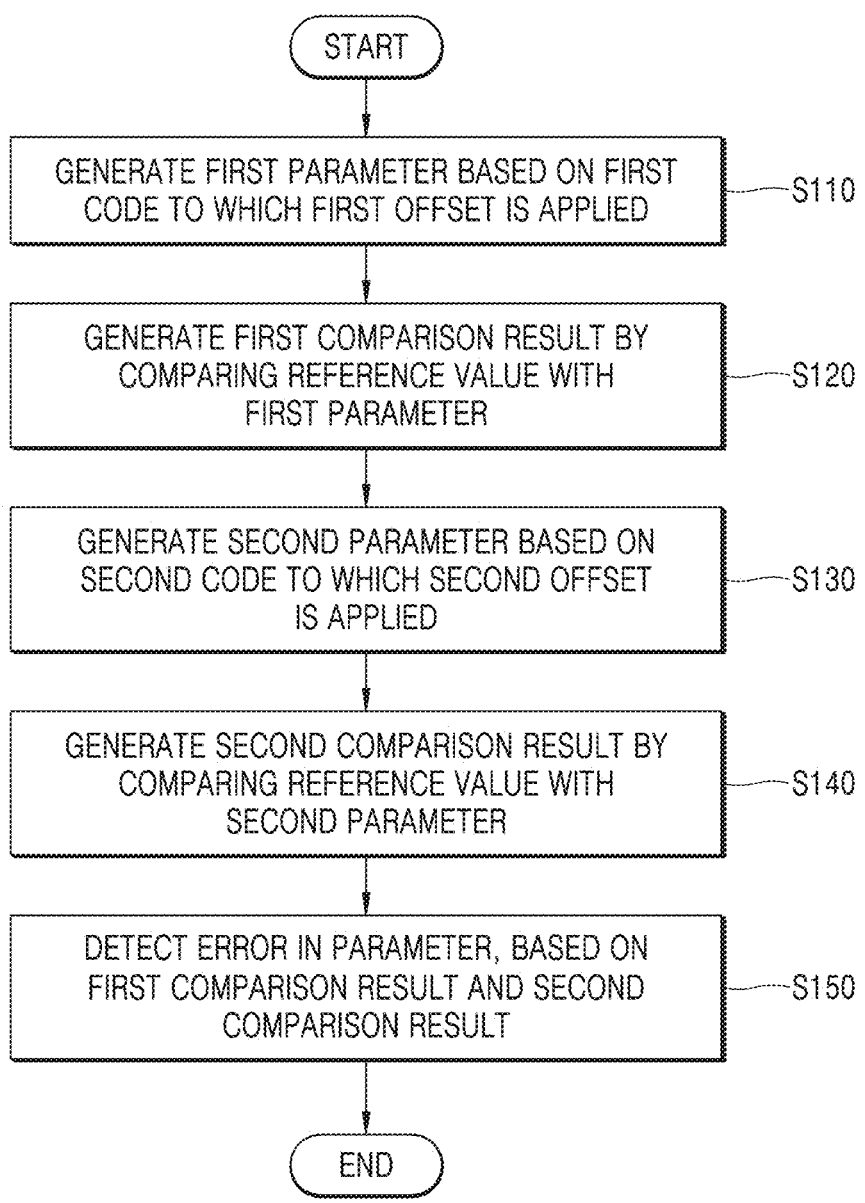

METHOD OF OPERATING A SYSTEM INCLUDING A PARAMETER MONITORING CIRCUIT

CROSS-REFERENCE TO RELATED APPLICATION

This is a divisional of U.S. application Ser. No. 16/861,903, filed Apr. 29, 2020, which claims priority to Korean Application No. 10-2019-0113036, filed on Sep. 11, 2019, the disclosures of each of which are hereby incorporated by reference in their entirety.

BACKGROUND

1. Field

At least some example embodiments of the inventive concepts relate to a parameter monitoring circuit, a duty cycle correction circuit, and an impedance calibration circuit, and more particularly, to a parameter monitoring circuit for detecting an error in a parameter, a duty cycle correction circuit for detecting a duty error in a clock signal, and an impedance calibration circuit for detecting an error in impedance.

2. Related Art

In various devices, parameters needed for operations of the devices are set to required values by adjusting or correcting the parameters based on codes. For example, a duty cycle correction circuit causes a clock signal to have a required target duty value by adjusting the duty of the clock signal based on a code, and an impedance calibration circuit or a ZQ calibration circuit forms a required impedance value based on a code.

When a parameter has a value having a great difference from a required value, there may be a need to detect the difference and train a code again. When the case where a parameter has a value having a great difference from a required value is referred to as an error in a parameter, there is demand for a method of determining an error situation of a parameter.

SUMMARY

At least some example embodiments of the inventive concepts provide a method and a device for detecting an error in a parameter without a separate monitoring device, in a parameter monitoring circuit, a duty cycle correction circuit, and an impedance calibration circuit.

According at least some example embodiments of the inventive concepts, a parameter monitoring circuit includes a code generation circuit configured to generate a first code, to which a first offset is applied, and a second code, to which a second offset is applied; a parameter adjustment circuit configured to generate a first parameter and a second parameter by respectively applying the first code and the second code to a current parameter; a comparator circuit configured to generate a first comparison result and a second comparison result, the first comparison result indicating a comparison result between the first parameter and a reference parameter value, and the second comparison result indicating a comparison result between the second parameter and the reference parameter value; and a parameter error detection circuit configured to detect an error in the current parameter, based on the first comparison result and the second comparison result.

According at least some example embodiments of the inventive concepts, there is provided a duty cycle correction circuit, which includes: a code generation circuit configured to generate a first code, to which a first offset is applied, and a second code, to which a second offset is applied; a duty adjustment circuit configured to generate a first clock signal by correcting a duty of a current clock signal by using the first code and generate a second clock signal by correcting the duty of the current clock signal by using the second code; a comparator circuit configured to generate a first comparison result and a second comparison result, the first comparison result indicating a comparison result between a first duty of the first clock signal and a target duty value, and the second comparison result indicating a comparison result between a second duty of the second clock signal and the target duty value; and a duty error detection circuit configured to detect a duty error in the current clock signal, based on the first comparison result and the second comparison result.

According at least some example embodiments of the inventive concepts, there is provided an impedance calibration circuit, which includes: a first code generation circuit configured to generate a first pull-up code, to which a first offset is applied, and a second pull-up code, to which a second offset is applied; a first pull-up driver configured to form a first impedance by using the first pull-up code and form a second impedance by using the second pull-up code; an impedance pin connected to the first pull-up driver and connected to an external impedance; a first comparator circuit configured to generate a pull-up comparison result based on a voltage of the impedance pin with a reference voltage value; and an impedance error detection circuit configured to detect an impedance error based on a first pull-up comparison result and a second pull-up comparison result, the first pull-up comparison result being based on the first impedance by the first pull-up driver, and the second pull-up comparison result being based on the second impedance by the first pull-up driver.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

FIG. 2 illustrates a flowchart of a parameter monitoring method of a parameter monitoring circuit, according to at least one example embodiment of the inventive concepts;

DETAILED DESCRIPTION OF THE EMBODIMENTS

Figure 1:
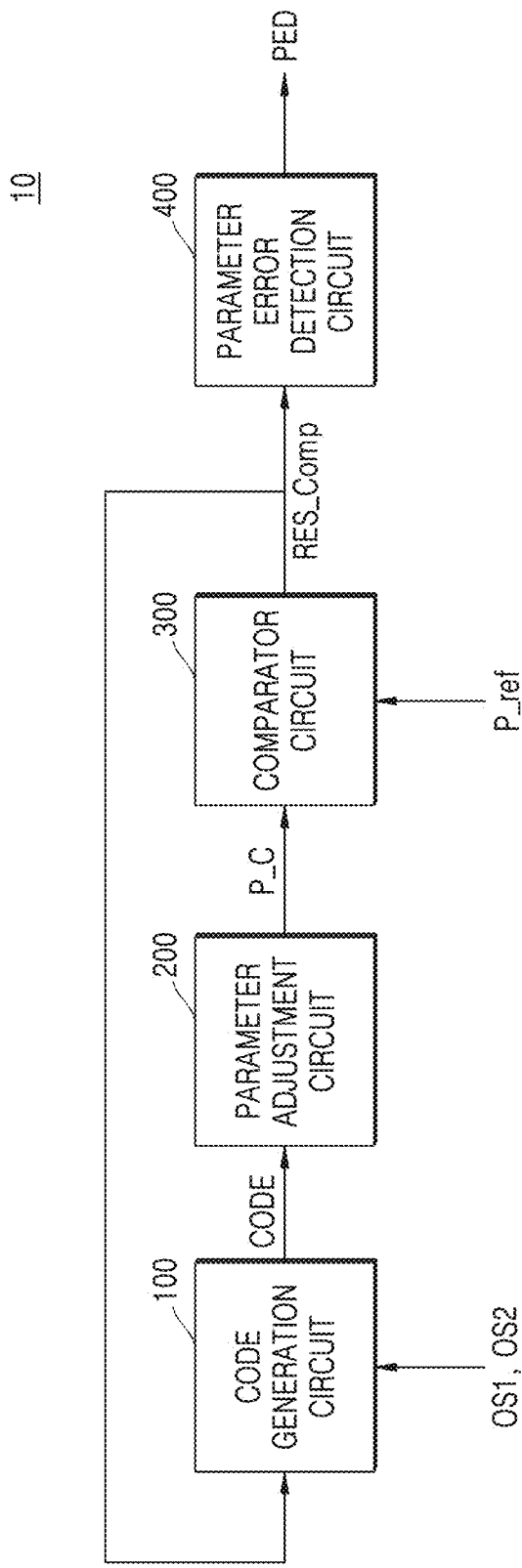
FIG. 1 illustrates a parameter monitoring circuit according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 illustrates a parameter monitoring circuit 10 according to at least one example embodiment of the inventive concepts. The parameter monitoring circuit 10 is a circuit for monitoring a parameter and may be implemented in any device for managing the parameter. For example, the parameter monitoring circuit 10 may be implemented in various devices for setting a parameter to a target parameter value or adjusting or correcting a parameter. According to at least one example embodiment of the inventive concepts, the parameter monitoring circuit 10 may be implemented in a device related to the parameter generated based on a code. According to at least one example embodiment of the inventive concepts, the parameter monitoring circuit 10 may be implemented in a duty clock correction (DCC) circuit and may also be implemented in an impedance calibration circuit. An embodiment in which the parameter monitoring circuit 10 is implemented in a duty clock correction circuit will be described in more detail with reference to FIGS. 8 to 11, and an embodiment in which the parameter monitoring circuit 10 is implemented in an impedance calibration circuit will be described in more detail with reference to FIGS. 12 and 13. However, at least some example embodiments of the inventive concepts are not limited to the above referenced embodiments. For example, the parameter monitoring circuit 10 may be applied to various circuits or devices such as a delay locked loop (DLL) or a phase locked loop (PLL).

The parameter monitoring circuit 10 may include a code generation circuit 100, a parameter adjustment circuit 200, a comparator circuit 300, and a parameter error detection circuit 400.

The code generation circuit 100 may generate a code CODE used for generation and/or correction of a parameter. In addition, the code generation circuit 100 may provide the generated code CODE to the parameter adjustment circuit 200. The code CODE may be an N-bit code (where N is a natural number), and according to at least one example embodiment of the inventive concepts, the code CODE may be a code having bits by as many as a power of 2. For example, the code CODE may be a code having bits such as 1 bit, 2 bits, 4 bits, 8 bits, or 16 bits. However, at least some example embodiments of the inventive concepts are not limited to a particular number of bits of the code CODE. According to at least one example embodiment of the inventive concepts, the code generation circuit 100 may generate a first code, to which a first offset OS1 is applied, and generate a second code, to which a second offset OS2 is applied. Here, each of the first offset OS1 and the second offset OS2 may refer to an offset with respect to a current code CODE, and may also refer to an offset for correcting the current code CODE. According to at least one example embodiment of the inventive concepts, in a parameter monitoring mode, the code generation circuit 100 may generate the first code, to which the first offset OS1 is applied, and generate the second code, to which the second offset OS2 is applied. The parameter monitoring mode may be set at every predetermined operation cycle or may be set according to a parameter monitoring command provided from outside the parameter monitoring circuit 10.

According to at least some example embodiments of the inventive concepts, the first offset OS1 may have a positive value, and the second offset OS2 may have a negative value. According to at least some example embodiments of the inventive concepts, the first offset OS1 may have a negative value, and the second offset OS2 may have a positive value. According to at least one example embodiment of the inventive concepts, the first offset OS1 and the second offset OS2 may have the same magnitude. In other words, according to at least one example embodiment of the inventive concepts, the first offset OS1 may be a positive offset having a first offset level, and the second offset OS2 may be a negative offset having the first offset level. As used herein, the expression "an offset is applied to a parameter" may mean that an offset is added to or subtracted from a current parameter value.

In the parameter monitoring mode, the code generation circuit 100 may provide the first code and the second code, which are generated, to the parameter adjustment circuit 200.

The parameter adjustment circuit 200 may generate a code-applied parameter P_C by using the code CODE provided from the code generation circuit 100. The parameter adjustment circuit 200 may provide the code-applied parameter P_C to the comparator circuit 300. According to at least some example embodiments of the inventive concepts, the parameter adjustment circuit 200 may generate the code-applied parameter P_C by using the code CODE. In addition, according to one embodiment, the parameter adjustment circuit 200 may generate the code-applied parameter P_C by applying the code CODE to an original parameter.

According to at least one example embodiment of the inventive concepts, in the parameter monitoring mode, the parameter adjustment circuit 200 may receive the first code, to which the first offset OS1 is applied, and the second code, to which the second offset OS2 is applied. Here, the first code and the second code may be simultaneously received or may be sequentially received over time. The parameter adjustment circuit 200 may generate a first parameter by using the first code and generate a second parameter by using the second code. For example, the parameter adjustment circuit 200 may generate the first parameter by applying the first code to an original parameter and generate the second parameter by applying the second code to the original parameter. In the parameter monitoring mode, the parameter adjustment circuit 200 may provide the first parameter and the second parameter to the comparator circuit 300.

The comparator circuit 300 may generate a comparison result RES_Comp by comparing the code-applied parameter P_C with a reference parameter value P_ref. Here, according to at least one example embodiment of the inventive concepts, the comparator circuit 300 may generate the comparison result RES_Comp by directly comparing the code-applied parameter P_C with the reference parameter value P_ref. For example, the comparator circuit 300 may include a comparator (320 in FIG. 4) configured to compare the code-applied parameter P_C with the reference parameter value P_ref. However, at least some example embodiments of the inventive concepts are not limited thereto, and the comparator circuit 300 may compare the code-applied parameter P_C with the reference parameter value P_ref by an indirect method. In addition, according to at least one example embodiment of the inventive concepts, the reference parameter value P_ref may be equal to or substantially equal to a target parameter value denoting a parameter value required by a circuit or device to which the parameter monitoring circuit 10 is applied. The comparator circuit 300 may provide the comparison result RES_Comp to the parameter error detection circuit 400.

According to at least one example embodiment of the inventive concepts, the reference parameter value P_ref may be determined based on error monitoring sensitivity required by the parameter monitoring circuit 10. For example, when the parameter monitoring circuit 10 requires high error monitoring sensitivity, the reference parameter value P_ref may be set to be small. Likewise, for example, when the parameter monitoring circuit 10 requires low error monitoring sensitivity, the reference parameter value P_ref may be set to be great. In addition, According to at least some example embodiments of the inventive concepts, the reference parameter value P_ref may be a fixed value or a variable value.

According to at least one example embodiment of the inventive concepts, in the parameter monitoring mode, the comparator circuit 300 may receive the first parameter and the second parameter from the parameter adjustment circuit 200. As described above, although the first parameter and the second parameter may be simultaneously received, at least some example embodiments of the inventive concepts are not limited thereto, and the first parameter and the second parameter may be sequentially received over time. The comparator circuit 300 may provide, to the parameter error detection circuit 400, a first comparison result obtained by comparing the first parameter with the reference parameter value P_ref, and may provide, to the parameter error detection circuit 400, a second comparison result obtained by comparing the second parameter with the reference parameter value P_ref.

In addition, according to at least one example embodiment of the inventive concepts, the comparator circuit 300 may provide the comparison result RES_Comp to the code generation circuit 100. In other words, the comparator circuit 300 may feed the comparison result RES_Comp back to the code generation circuit 100. According to at least one example embodiment of the inventive concepts, the code generation circuit 100 may generate the code CODE based on the comparison result RES_Comp that is fed back. As such, the parameter monitoring circuit 10 may include a closed loop-type signal transfer path.

The parameter error detection circuit 400 may detect an error in a parameter, based on the comparison result RES_Comp provided from the comparator circuit 300. For example, the parameter error detection circuit 400 may detect an error in the parameter, based on the first comparison result and the second comparison result, which are received from the comparator circuit 300, in the parameter monitoring mode. According to at least one example embodiment of the inventive concepts, in response to the fact that the first comparison result and the second comparison result have the same logic level, the parameter error detection circuit 400 may determine that such a situation is an error situation in which there is an error in the parameter. In addition, according to at least one example embodiment of the inventive concepts, in response to the fact that the first comparison result and the second comparison result have different logic levels from each other, the parameter error detection circuit 400 may determine that such a situation is a normal situation in which there is no error in the parameter.

Herein, an error in a parameter may occur according to various situations. For example, an error in a parameter may occur because the parameter is not locked to a correct target value from the beginning, and may also occur because, although the parameter is locked to a correct target value at first, the value of the parameter varies afterwards according to changes in surrounding circumstances. As used herein, the expression "a parameter is locked" or "the locking of a parameter" may mean that the parameter is fixed to a target value.

The parameter error detection circuit 400 may output a parameter error detection signal PED according to whether an error in the parameter is detected. For example, when there is an error in the parameter, the parameter error detection circuit 400 may output the parameter error detection signal PED having a first logic level. In addition, for example, when there is no error in the parameter, the parameter error detection circuit 400 may output the parameter error detection signal PED having a second logic level that is different from the first logic level. However, at least some example embodiments of the inventive concepts are not limited thereto and, as another example, the parameter error detection circuit 400 may activate the parameter error detection signal PED only when there is an error in the parameter.

According to at least one example embodiment of the inventive concepts, the parameter error detection circuit 400 may include memory for storing the first comparison result, and a logic circuit for performing a logic operation by using the first comparison result and the second comparison result. The logic circuit may include an XOR gate circuit for performing an exclusive OR operation by using the first comparison result and the second comparison result. This will be described in more detail with reference to FIG. 5.

According to at least one example embodiment of the inventive concepts, an operating frequency of the parameter monitoring circuit 10 may be 1 GHz or more.

According to the parameter monitoring circuit 10 according to at least one example embodiment of the inventive concepts, the parameter monitoring circuit 10 may sequentially generate codes, to which the first offset OS1 and the second offset OS2 are respectively applied, and may detect an error in the parameter based on the first comparison result and the second comparison result due thereto. Thus, a device, in which the parameter monitoring circuit 10 is implemented, may detect or monitor an error in the parameter without a separate monitoring device.

In particular, at least some selected from the code generation circuit 100, the parameter adjustment circuit 200, and the comparator circuit 300 may be pre-provided hardware resources used for other purposes in the device in which the parameter monitoring circuit 10 is implemented. Therefore, the parameter monitoring circuit 10 may also improve efficiency in hardware implementation by detecting an error in the parameter by using the pre-provided hardware resources.

FIG. 2 illustrates a flowchart of a parameter monitoring method of a parameter monitoring circuit, according to at least one example embodiment of the inventive concepts Descriptions regarding FIG. 2 will be made with reference to FIG. 1 together.

The parameter monitoring circuit 10 may generate the first parameter based on the first code to which the first offset OS1 is applied (S110). For example, the code generation circuit 100 may generate the first code, to which the first offset OS1 is applied, and may provide the first code to the parameter adjustment circuit 200. The parameter adjustment circuit 200 may generate the first parameter by using the first code.

The parameter monitoring circuit 10 may generate the first comparison result by comparing the first parameter with the reference parameter value P_ref (S120). For example, the comparator circuit 300 may directly or indirectly compare the first parameter with the reference parameter value P_ref and may generate the first comparison result. The comparator circuit 300 may provide the first comparison result to the parameter error detection circuit 400. The parameter error detection circuit 400 may store the first comparison result in memory (or a flip-flop) internal thereto.

The parameter monitoring circuit 10 may generate the second parameter based on the second code to which the second offset OS2 is applied (S130). For example, the code generation circuit 100 may generate the second parameter based on the second code to which the second offset OS2 is applied and may provide the second code to the parameter adjustment circuit 200. The parameter adjustment circuit 200 may generate the second parameter by using the second code.

The parameter monitoring circuit 10 may generate the second comparison result by comparing the second parameter with the reference parameter value P_ref (S140). For example, the comparator circuit 300 may directly or indirectly compare the second parameter with the reference parameter value P_ref and may generate the second comparison result. The comparator circuit 300 may provide the second comparison result to the parameter error detection circuit 400.

The parameter monitoring circuit 10 may detect an error in the parameter based on the first comparison result and the second comparison result (S150). For example, the parameter error detection circuit 400 may detect an error in the parameter, based on the first comparison result and the second comparison result, which are temporarily stored therein. For example, the parameter error detection circuit 400 may detect an error in the parameter by performing an exclusive OR operation by using the first comparison result and the second comparison result.

Figure 3A:
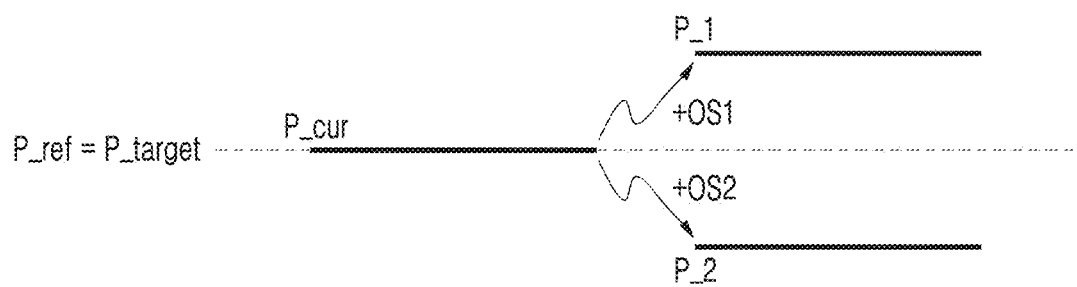
FIG. 3A illustrates a conceptual diagram of a situation in which an offset is applied to a normal parameter, according to at least one example embodiment of the inventive concepts.

FIG. 3A illustrates a conceptual diagram of a situation in which an offset is applied to a normal parameter, according to at least one example embodiment of the inventive concepts. Here, the term "normal parameter" refers to the case where a current parameter P_cur has a value that is equal to or substantially equal to a required target parameter value P_target. Descriptions regarding FIG. 3A will be made with reference to FIG. 1 together.

According to at least one example embodiment of the inventive concepts, the reference parameter value P_ref may be equal to the target parameter value P_target denoting a required parameter value. In FIG. 3A, a line located higher than a line of the reference parameter value P_ref indicates that the higher-located line has a value greater than the reference parameter value P_ref, and a line located lower than the line of the reference parameter value P_ref indicates that the lower-located line has a value less than the reference parameter value P_ref.

According to at least one example embodiment of the inventive concepts, in the parameter monitoring mode, the code generation circuit 100 may generate the first code, to which the first offset OS1 is applied, and may generate the second code, to which the second offset OS2 is applied. The parameter adjustment circuit 200 may generate a first parameter P_1 based on the first code and may generate a second parameter P_2 based on the second code. For example, the parameter adjustment circuit 200 may generate a first parameter P_1 by applying the first code to an original parameter and may generate a second parameter P_2 by applying the second code to the original parameter. According to at least one example embodiment of the inventive concepts, the first offset OS1 may have a positive value, and the second offset OS2 may have a negative value.

Referring to FIG. 3A, when the parameter is in a normal situation, the first parameter P_1 according to the first code, to which the first offset OS1 is applied, has a value greater than the reference parameter value P_ref. Likewise, when the parameter is in a normal situation, the second parameter P_2 according to the second code, to which the second offset OS2 is applied, has a value less than the reference parameter value P_ref.

Figure 3B:
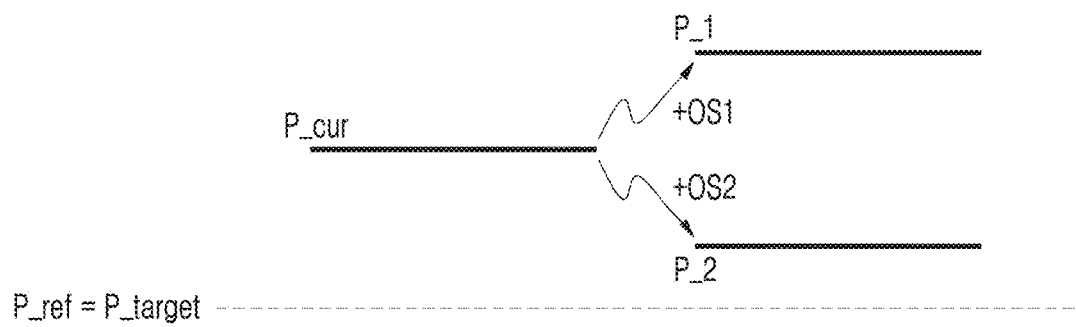
FIG. 3B illustrates a conceptual diagram of a situation in which an offset is applied to a parameter having a positive error, according to at least one example embodiment of the inventive concepts.

FIG. 3B illustrates a conceptual diagram of a situation in which an offset is applied to a parameter having a positive error, according to at least one example embodiment of the inventive concepts. Here, the expression "a parameter having a positive error" denotes the case where the current parameter P_cur has a value of a positive error from the reference parameter value P_ref. In particular, the expression "a parameter having a positive error" may denote the case where the current parameter P_cur has a value of a positive error out of an acceptable range of an error from the reference parameter value P_ref. Descriptions regarding FIG. 3B will also be made with reference to FIG. 1 together.

According to at least one example embodiment of the inventive concepts, the reference parameter value P_ref may be equal to the target parameter value P_target denoting a required parameter value. In FIG. 3B, a line located higher than the line of the reference parameter value P_ref indicates that the higher-located line has a value greater than the reference parameter value P_ref, and a line located lower than the line of the reference parameter value P_ref indicates that the lower-located line has a value less than the reference parameter value P_ref.

According to at least one example embodiment of the inventive concepts, in the parameter monitoring mode, the code generation circuit 100 may generate the first code, to which the first offset OS1 is applied, and may generate the second code, to which the second offset OS2 is applied. The parameter adjustment circuit 200 may generate the first parameter P_1 based on the first code and may generate the second parameter P_2 based on the second code. According to at least one example embodiment of the inventive concepts, the first offset OS1 may have a positive value, and the second offset OS2 may have a negative value. Referring to FIG. 3B, when the parameter has a positive error, the first parameter P_1 according to the first code, to which the first offset OS1 is applied, has a value greater than the reference parameter value P_ref. Likewise, when the parameter has a positive error, the second parameter P_2 according to the second code, to which the second offset OS2 is applied, has a value greater than the reference parameter value P_ref. As compared with FIG. 3A, there is a difference in that the second parameter P_2 has a value greater than the reference parameter value P_ref.

Figure 3C:
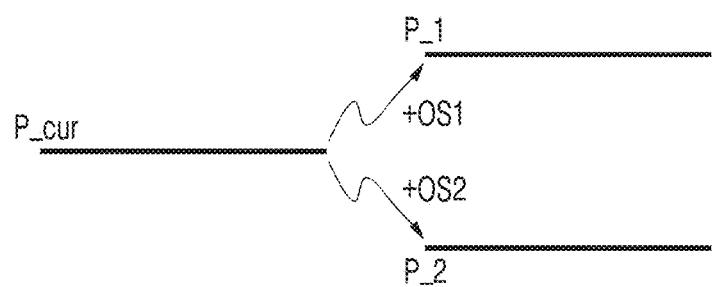
FIG. 3C illustrates a conceptual diagram of a situation in which an offset is applied to a parameter having a negative error, according to at least one example embodiment of the inventive concepts.

FIG. 3C illustrates a conceptual diagram of a situation in which an offset is applied to a parameter having a negative error, according to at least one example embodiment of the inventive concepts. Here, the expression "a parameter having a negative error" denotes the case where the current parameter P_cur has a value of a negative error from the reference parameter value P_ref. In particular, the expression "a parameter having a negative error" may denote the case where the current parameter P_cur has a value of a negative error out of an acceptable range of an error from the reference parameter value P_ref. Descriptions regarding FIG. 3C will also be made with reference to FIG. 1 together.

According to at least one example embodiment of the inventive concepts, the reference parameter value P_ref may be equal to the target parameter value P_target denoting a required parameter value. In FIG. 3C, a line located higher than the line of the reference parameter value P_ref indicates that the higher-located line has a value greater than the reference parameter value P_ref, and a line located lower than the line of the reference parameter value P_ref indicates that the lower-located line has a value less than the reference parameter value P_ref.

According to at least one example embodiment of the inventive concepts, in the parameter monitoring mode, the code generation circuit 100 may generate the first code, to which the first offset OS1 is applied, and may generate the second code, to which the second offset OS2 is applied. The parameter adjustment circuit 200 may generate the first parameter P_1 based on the first code and may generate the second parameter P_2 based on the second code. According to at least one example embodiment of the inventive concepts, the first offset OS1 may have a positive value, and the second offset OS2 may have a negative value. Referring to FIG. 3C, when the parameter has a negative error, the first parameter P_1 according to the first code, to which the first offset OS1 is applied, has a value less than the reference parameter value P_ref. Likewise, when the parameter has a positive error, the second parameter P_2 according to the second code, to which the second offset OS2 is applied, has a value less than the reference parameter value P_ref. As compared with FIG. 3A, there is a difference in that the first parameter P_1 has a value less than the reference parameter value P_ref.

To sum up FIGS. 3A to 3C, when the current parameter P_cur is in a normal situation, the first parameter P_1 and the second parameter P_2 may be in different directions from each other with respect to the line of the reference parameter value P_ref in terms of the up-and-down direction, whereas, when the current parameter P_cur is in an error situation, the first parameter P_1 and the second parameter P_2 may be in the same direction with respect to the line of the reference parameter value P_ref in terms of the up-and-down direction. The parameter monitoring circuit 10 may detect an error in the parameter by using these characteristics. This will be described in more detail with reference to the following figures.

Figure 4:
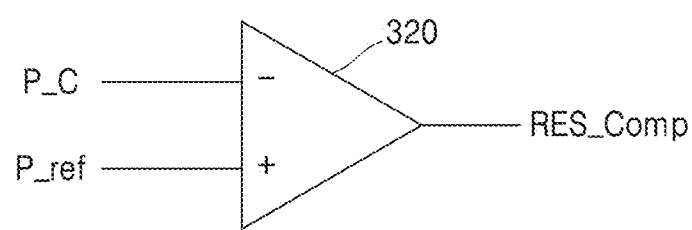
FIG. 4 illustrates a comparator circuit according to at least one example embodiment of the inventive concepts.

FIG. 4 illustrates a comparator circuit 300 according to at least one example embodiment of the inventive concepts. The comparator circuit 300 of FIG. 4 may be a component corresponding to the comparator circuit 300 of FIG. 1. Regarding the comparator circuit 300 of FIG. 4, repeated descriptions given with reference to FIG. 1 will be omitted.

In particular, FIG. 4 illustrates an embodiment of the comparator circuit 300 which directly compares the code-applied parameter P_C with the reference parameter value P_ref. That is, the comparator circuit 300 may include a comparator 320.

The comparator 320 may output the comparison result RES_Comp by comparing the code-applied parameter P_C with the reference parameter value P_ref. Although FIG. 4 illustrates that, according to one embodiment, the reference parameter value P_ref is input to an anode of the comparator 320 and the code-applied parameter P_C is input to a cathode of the comparator 320, at least some example embodiments of the inventive concepts are not limited thereto. On the contrary, the code-applied parameter P_C may be input to the anode of the comparator 320 and the reference parameter value P_ref may be input to the cathode of the comparator 320. According to at least some example embodiments of the inventive concepts, the comparator 320 is a circuit configured to output the comparison result RES_Comp such that a value of the comparison result RES_Comp indicates whether the code-applied parameter P_C is greater than the reference parameter value P_ref or less than the reference parameter value P_ref. For example, according to at least some example embodiments of the inventive concepts, the comparator 320 may be a circuit that generates the comparison result RES_Comp as a binary value (e.g., "0" or "1") indicating whether the code-applied parameter P_C is greater than (e.g., "0" or, alternatively "1"), or less than (e.g., "1" or, alternatively "0"), the reference parameter value P_ref.

Figure 5:
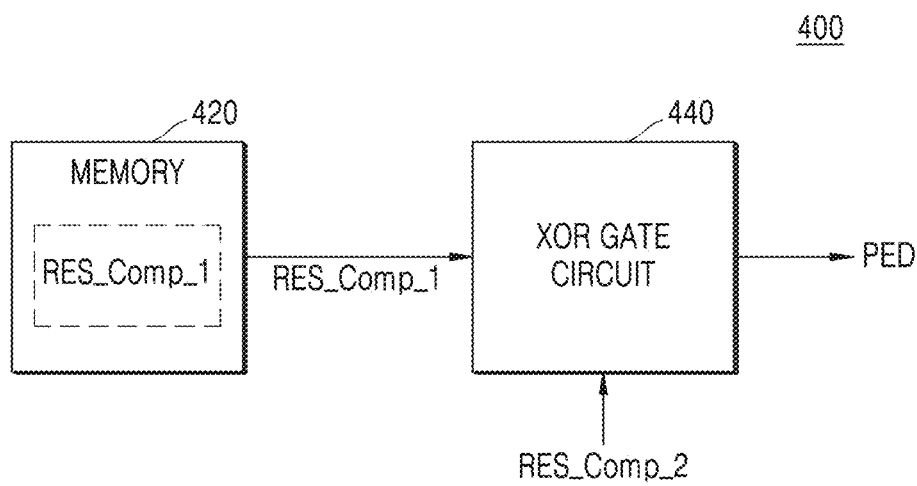
FIG. 5 illustrates a parameter error detection circuit according to at least one example embodiment of the inventive concepts.

FIG. 5 illustrates a parameter error detection circuit 400 according to at least one example embodiment of the inventive concepts. The parameter error detection circuit 400 of FIG. 5 may be a component corresponding to the parameter error detection circuit 400 of FIG. 1. Regarding the parameter error detection circuit 400 of FIG. 5, repeated descriptions given with reference to FIG. 1 will be omitted.

The parameter error detection circuit 400 may include memory 420 and an XOR gate circuit 440.

The memory 420 may store a comparison result that is input from outside the parameter error detection circuit 400. For example, in the parameter monitoring mode, when a first comparison result RES_Comp_1 and a second comparison result RES_Comp_2 are sequentially input in this stated order, the memory 420 may provide the first comparison result RES_Comp_1 to the XOR gate circuit 440. The memory 420 may be implemented by using various types of volatile memory and various types of non-volatile memory, without being limited thereto, and all components capable of temporarily storing data may be included in the memory 420. For example, the memory 420 may be implemented by a flip-flop.

According to at least one example embodiment of the inventive concepts, the memory 420 may temporarily store both the first comparison result RES_Comp_1 and the second comparison result RES_Comp_2. In this case, the memory 420 may provide both the first comparison result RES_Comp_1 and the second comparison result RES_Comp_2 to the XOR gate circuit 440. According to at least one example embodiment of the inventive concepts, the memory 420 may include a first flip-flop temporarily storing the first comparison result RES_Comp_1, and a second flip-flop temporarily storing the second comparison result RES_Comp_2.

The XOR gate circuit 440 may output the parameter error detection signal PED by performing a logic operation by using the first comparison result RES_Comp_1 and the second comparison result RES_Comp_2. For example, the XOR gate circuit 440 may output the parameter error detection signal PED by performing an exclusive OR operation by using the first comparison result RES_Comp_1 and the second comparison result RES_Comp_2. According to at least one example embodiment of the inventive concepts, the XOR gate circuit 440 may output, to the outside of a parameter monitoring circuit, the parameter error detection signal PED as an error correction directing signal for directing an operation of correcting an error in the parameter. Here, the outside of the parameter monitoring circuit may be a host of a system including the parameter monitoring circuit. The host may perform retraining of a code on the parameter in response to receiving the error correction directing signal. For example, the host may adjust the code based on the parameter error detection signal, and provide the adjusted code to the code generation circuit 100, which may generate first and second codes based, respectively, on first and second offsets OS1 and OS2.

For example, referring to the embodiment of FIG. 3A, in a normal situation of the parameter, because the first parameter P_1 is greater than the reference parameter value P_ref, the first comparison result RES_Comp_1 may indicate a first logic level (as a non-limiting example, '0'), and because the second parameter P_2 is less than the reference parameter value P_ref, the second comparison result RES_Comp_2 may indicate a second logic level (as a non-limiting example, '1'). Accordingly, the XOR gate circuit 440 may output the parameter error detection signal PED indicating the second logic level (for example, '1') by performing an exclusive OR operation by using the first comparison result RES_Comp_1 and the second comparison result RES_Comp_2. Here, the parameter error detection signal PED indicating the second logic level may represent a normal situation.

In addition, for example, referring to the embodiment of FIG. 3B, in a situation of a positive error in a parameter, because the first parameter P_1 is greater than the reference parameter value P_ref, the first comparison result RES_Comp_1 may indicate the first logic level (for example, '0'), and because the second parameter P_2 is also greater than the reference parameter value P_ref, the second comparison result RES_Comp_2 may also indicate the first logic level (for example, '0'). Accordingly, the XOR gate circuit 440 may output the parameter error detection signal PED indicating the first logic level (for example, '0') by performing an exclusive OR operation by using the first comparison result RES_Comp_1 and the second comparison result RES_Comp_2. Here, the parameter error detection signal PED indicating the first logic level may represent an error situation.

In addition, for example, referring to the embodiment of FIG. 3C, in a situation of a negative error in the parameter, because the first parameter P_1 is less than the reference parameter value P_ref, the first comparison result RES_Comp_1 may indicate the second logic level (for example, '1'), and because the second parameter P_2 is also less than the reference parameter value P_ref, the second comparison result RES_Comp_2 may also indicate the second logic level (for example, '1'). Accordingly, the XOR gate circuit 440 may output the parameter error detection signal PED indicating the first logic level (for example, '0') by performing an exclusive OR operation by using the first comparison result RES_Comp_1 and the second comparison result RES_Comp_2. Here, the parameter error detection signal PED indicating the first logic level may represent an error situation.

Figure 6:
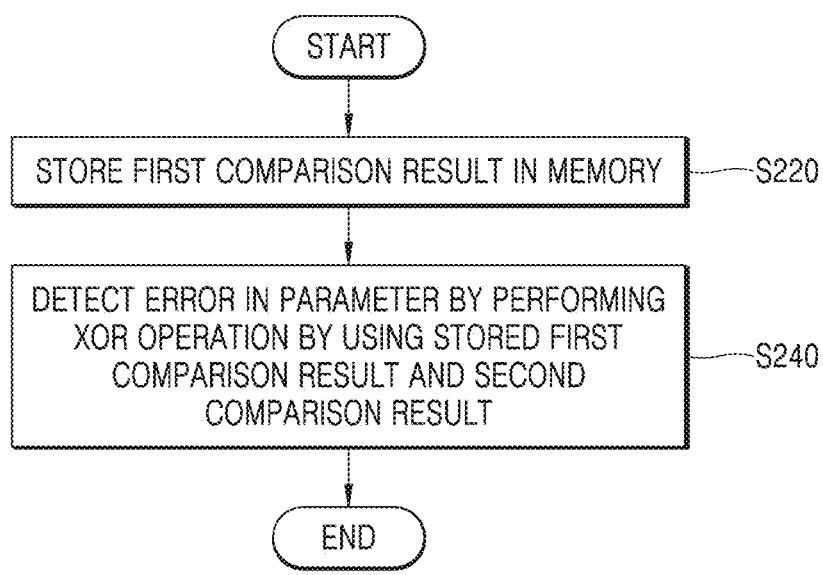
FIG. 6 illustrates a flowchart of an error detection method of a parameter error detection circuit, according to at least one example embodiment of the inventive concepts.

FIG. 6 illustrates a flowchart of an error detection method of a parameter error detection circuit, according to at least one example embodiment of the inventive concepts. Descriptions regarding FIG. 6 will be made with reference to FIG. 5 together.

The parameter error detection circuit 400 may store the first comparison result RES_Comp_1 in the memory 420 (S220). For example, when the first comparison result RES_Comp_1 and the second comparison result RES_Comp_2 are sequentially input in this stated order, the parameter error detection circuit 400 may temporarily store the first comparison result RES_Comp_1 in the memory 420.

The parameter error detection circuit 400 may detect an error in the parameter by performing an exclusive OR operation by using the first comparison result RES_Comp_1, which is stored in the memory 420, and the second comparison result RES_Comp_2 (S240). For example, the XOR gate circuit 440 may output the parameter error detection signal PED by performing an exclusive OR operation by using the first comparison result RES_Comp_1, which is provided from the memory 420, and the second comparison result RES_Comp_2.

Figure 7:
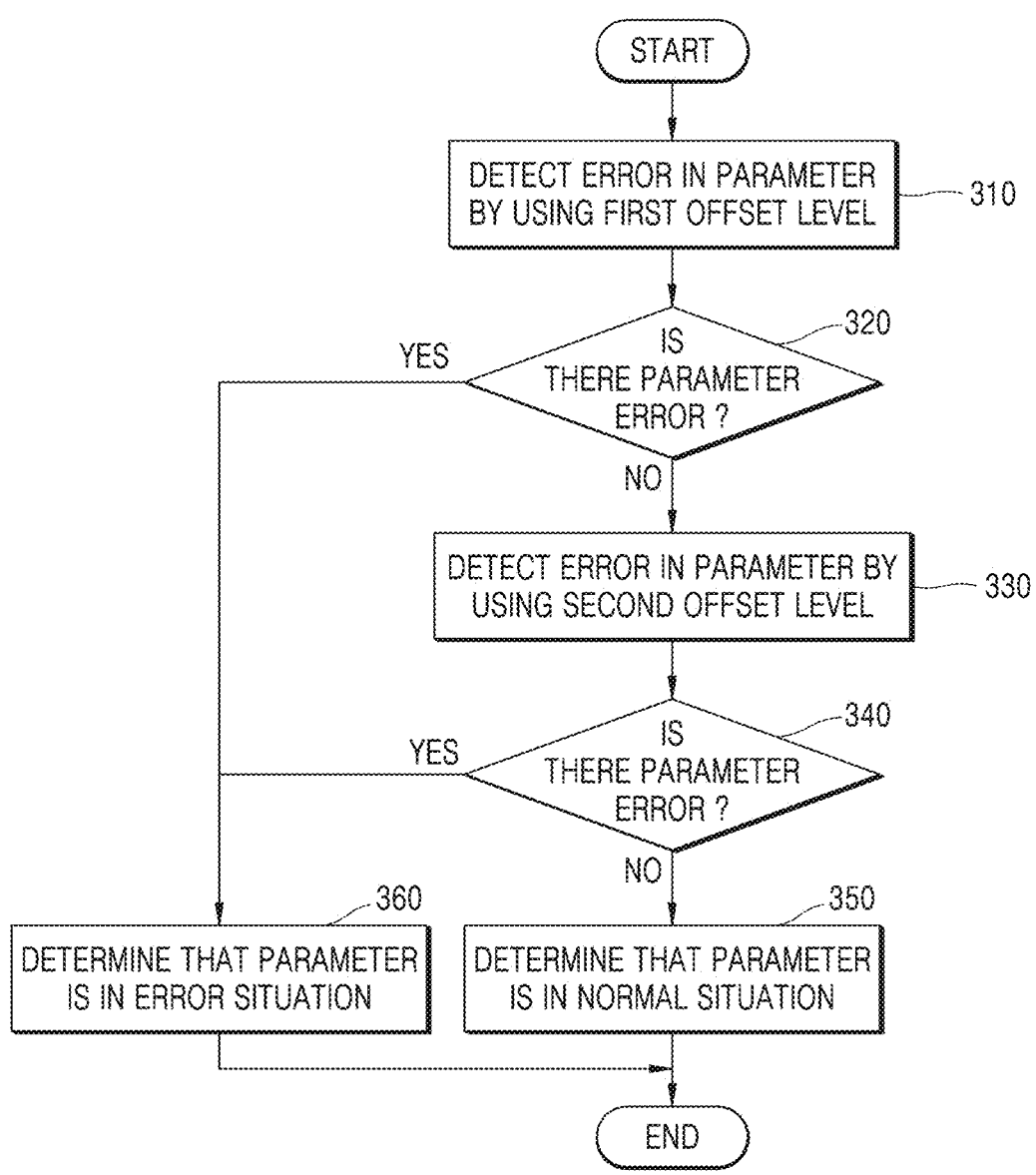
FIG. 7 illustrates a flowchart of a parameter monitoring method of a parameter monitoring circuit, according to at least one example embodiment of the inventive concepts.

FIG. 7 illustrates a flowchart of a parameter monitoring method of a parameter monitoring circuit, according to at least one example embodiment of the inventive concepts. In particular, FIG. 7 illustrates an embodiment of a method of monitoring a parameter when it is intended to more precisely detect a parameter error. Descriptions regarding FIG. 7 will be made with reference to FIG. 1 together.

The parameter monitoring circuit 10 may detect an error in the parameter by using a first offset level (S310). Operation S310 may include operations S110 to S150 in FIG. 2, wherein the first offset OS1 may have a positive value of a first offset level and the second offset OS2 may have a negative value of the first offset level. In other words, the parameter monitoring circuit 10 may detect an error in the parameter by applying the first offset OS1 and the second offset OS2, each having an absolute value (or magnitude) of the first offset level.

According to whether an error in the parameter is detected or not, the next operation may vary (S320). When an error in the parameter is detected, operation S360 may be performed. Otherwise, when an error in the parameter is not detected, operation S330 may be performed.

In detecting an error in the parameter by using the first offset level, when an error in the parameter is not detected, the parameter monitoring circuit 10 may detect an error in the parameter by using a second offset level (S330). Operation S330 may include operations S110 to S150 in FIG. 2, wherein the first offset OS1 may have a positive value of the second offset level and the second offset OS2 may have a negative value of the second offset level. In other words, the parameter monitoring circuit 10 may re-detect an error in the parameter by applying the first offset OS1 and the second offset OS2, each having an absolute value (or magnitude) of the second offset level. According to at least one example embodiment of the inventive concepts, the second offset level may have a value that is less than that of the first offset level.

Referring to FIGS. 3A and 3B, when detection is performed by using a smaller offset level, an error in the parameter may be detected by using higher sensitivity. That is, when a smaller offset level is used, a smaller error occurring in the parameter may be detected.

According to whether an error in the parameter is detected or not, the next operation may vary (S340). When an error in the parameter is detected, operation S360 may be performed. Otherwise, when an error in the parameter is not detected, operation S350 may be performed.

In detecting an error in the parameter by using the second offset level, when an error in the parameter is not detected, the parameter monitoring circuit 10 may determine that the parameter is in a normal situation (S350).

On the other hand, in detecting an error in the parameter by using the first offset level or detecting an error in the parameter by using the second offset level, when an error in the parameter is detected, the parameter monitoring circuit 10 may determine that the parameter is in an error situation (S360).

Figure 8:
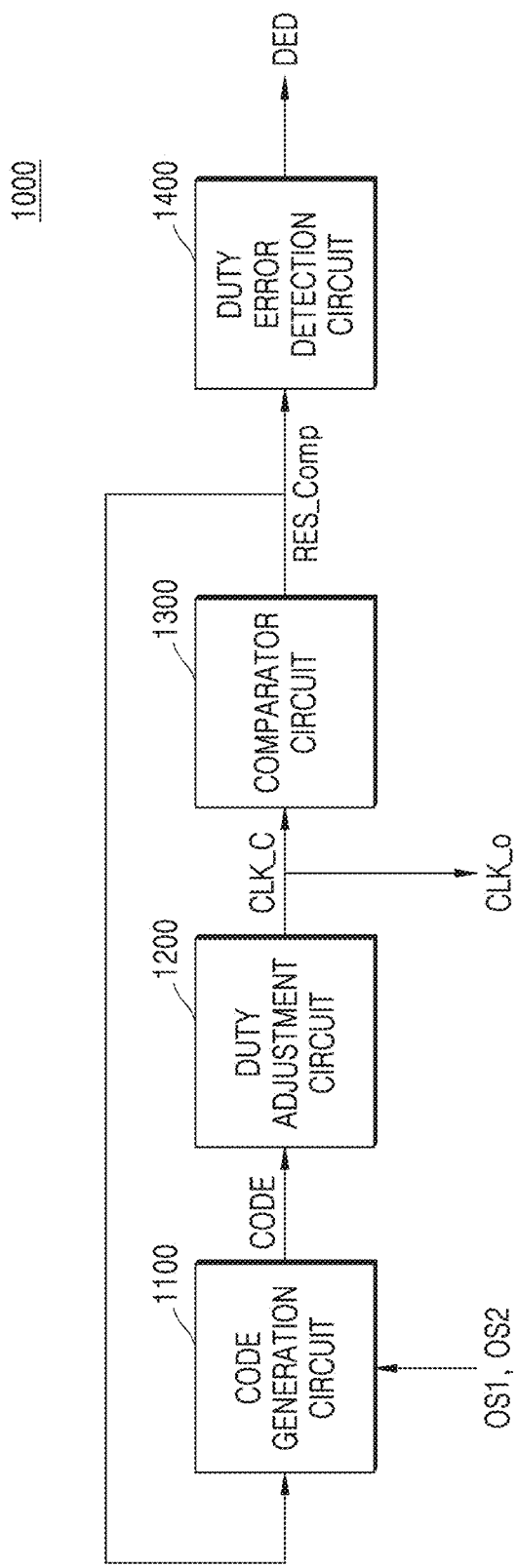
FIG. 8 illustrates a duty cycle correction circuit according to at least one example embodiment of the inventive concepts.

FIG. 8 illustrates a duty cycle correction circuit 1000 according to at least one example embodiment of the inventive concepts. The duty cycle correction circuit 1000 may correspond to the parameter monitoring circuit 10 of FIG. 1. In other words, the embodiments described with reference to FIGS. 1 to 7 may also be equally applied to the duty cycle correction circuit 1000.

The duty cycle correction circuit 1000 may include a code generation circuit 1100, a duty adjustment circuit 1200, a comparator circuit 1300, and a duty error detection circuit 1400.

The code generation circuit 1100 may correspond to the code generation circuit 100 of FIG. 1. That is, the code generation circuit 1100 may generate a code CODE for adjusting a duty. According to at least one example embodiment of the inventive concepts, in a duty monitoring mode, the code generation circuit 1100 may generate a first code, to which a first duty offset DOS1 is applied, and a second code, to which a second duty offset DOS2 is applied. The code generation circuit 1100 may provide the first code and the second code to the duty adjustment circuit 1200.

The duty adjustment circuit 1200 may correspond to the parameter adjustment circuit 200 of FIG. 1. The duty adjustment circuit 1200 may adjust a duty of a clock signal by using a current clock signal and the code CODE and may generate a code-applied clock signal CLK_C. According to at least one example embodiment of the inventive concepts, the duty adjustment circuit 1200 may output the code-applied clock signal CLK_C as an output clock signal CLK_o to the outside of the duty cycle correction circuit 1000. According to at least one example embodiment of the inventive concepts, in the duty monitoring mode, the duty adjustment circuit 1200 may provide a first clock signal and a second clock signal to the comparator circuit 1300, the first clock signal having a duty adjusted based on the first code, and the second clock signal having a duty adjusted based on the second code.

The comparator circuit 1300 may correspond to the comparator circuit 300 of FIG. 1. In particular, the comparator circuit 1300 may compare a duty of the code-applied clock signal CLK_C with a required target duty. According to at least one example embodiment of the inventive concepts, the target duty may be 0.5 or 50%. The comparator circuit 1300 may compare the duty of the code-applied clock signal CLK_C with the target duty by an indirect method. The comparator circuit 1300 may output, as a comparison result RES_Comp, a result obtained by comparing the duty of the code-applied clock signal CLK_C with the target duty and, according to at least one example embodiment of the inventive concepts, the comparator circuit 1300 may provide the comparison result RES_Comp to the duty error detection circuit 1400 and the code generation circuit 1100. According to at least one example embodiment of the inventive concepts, in the duty monitoring mode, the comparator circuit 1300 may output a first comparison result by comparing a duty of the first clock signal with the target duty and may output a second comparison result by comparing a duty of the second clock signal with the target duty.

The duty error detection circuit 1400 may correspond to the parameter error detection circuit 400 of FIG. 1. That is, the duty error detection circuit 1400 may detect an error in the duty of the current clock signal by using the comparison result RES_Comp provided from the comparator circuit 1300. According to at least one example embodiment of the inventive concepts, in the duty monitoring mode, the duty error detection circuit 1400 may output a duty error detection signal DED by using the first comparison result and the second comparison result. For this purpose, the duty error detection circuit 1400 may be implemented as in FIG. 5.

According to the duty cycle correction circuit 1000 according to at least one example embodiment of the inventive concepts, the duty cycle correction circuit 1000 may sequentially generate codes, to which the first duty offset DOS1 and the second duty offset DOS2 are respectively applied, and may detect an error in the duty of the clock signal based on the first comparison result and the second comparison result, both due thereto. Thus, the duty cycle correction circuit 1000 may detect or monitor an error in the duty of the clock signal without a separate monitoring device.

In particular, at least some selected from the code generation circuit 1100, the duty adjustment circuit 1200, and the comparator circuit 1300 may be pre-provided hardware resources used for the purpose of duty correction in addition to the purpose of duty monitoring, in the duty cycle correction circuit 1000. Therefore, the duty cycle correction circuit 1000 may also improve efficiency in hardware implementation by detecting an error in the duty of the clock signal by using the pre-provided hardware resources.

In addition, according to at least one example embodiment of the inventive concepts, the duty cycle correction circuit 1000 may be implemented inside various memory devices such as a non-volatile memory device. Here, the non-volatile memory device may include NAND flash memory, vertical NAND flash memory, NOR flash memory, resistive random access memory (RRAM), phase-change random access memory (PRAM), magnetoresistive random access memory (MRAM), ferroelectric random access memory (FRAM), spin transfer torque random access memory (STT-RAM), or a combination thereof. According to at least one example embodiment of the inventive concepts, the non-volatile memory device may have a structure in which 100 or more layers are stacked. In addition, according to at least one example embodiment of the inventive concepts, the non-volatile memory device may have a cell-on-peri or cell-over-peri (COP) structure. Here, the duty cycle correction circuit 1000 may detect an error in the duty of the clock signal in a latency interval related to a data operation corresponding to a data operation command that is input to the memory device, thereby detecting an error in the duty of the clock signal without an additional time interval. In other words, the duty cycle correction circuit 1000 may detect an error situation occurring in the duty of the clock signal without consuming additional time.

Figure 9:
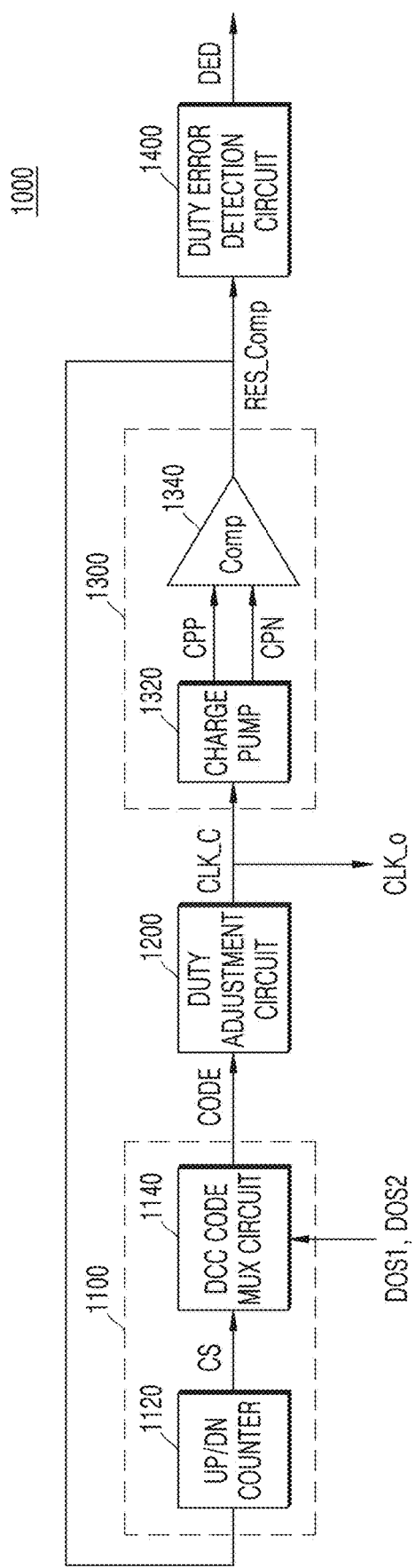
FIG. 9 illustrates a duty cycle correction circuit according to at least one example embodiment of the inventive concepts.

FIG. 9 illustrates a duty cycle correction circuit 1000 according to at least one example embodiment of the inventive concepts. FIG. 9 may illustrate a more detailed implementation example of the duty cycle correction circuit 1000 of FIG. 8.

The code generation circuit 1100 may include an up/down counter 1120 and a DCC code multiplexer (MUX) circuit 1140. The up/down counter 1120 may generate a control signal CS based on the comparison result RES_Comp. For example, the control signal CS may be a 4-bit digital code, and the up/down counter 1120 may increase or decrease the code of the control signal CS by as much as 1 according to a logic level indicated by the comparison result RES_Comp.

The DCC code MUX circuit 1140 may generate a code CODE based on the control signal CS provided by the up/down counter 1120. For this purpose, the DCC code MUX circuit 1140 may be implemented by using a plurality of transistors. In the duty monitoring mode, the DCC code MUX circuit 1140 may generate a first code by applying the first duty offset DOS1 and may generate a second code by applying the second duty offset DOS2. The DCC code MUX circuit 1140 may provide the generated code CODE to the duty adjustment circuit 1200.

The comparator circuit 1300 may include a charge pump 1320 and a comparator 1340.

The charge pump 1320 may generate a first charge pump signal CPP and a second charge pump signal CPN based on the output clock signal CLK_o. According to at least one example embodiment of the inventive concepts, the charge pump 1320 may receive two phase-separated clock signals, which have phases separated by a phase splitter, and may generate the first charge pump signal CPP and the second charge pump signal CPN, based on the two phase-separated clock signals.

The comparator 1340 may output the comparison result RES_Comp by comparing the first charge pump signal CPP with the second charge pump signal CPN. As a result, according to at least one example embodiment of the inventive concepts, when on-time of the output clock signal CLK_o or the code-applied clock signal CLK_C is longer than off-time thereof, the comparator 1340 may output the comparison result RES_Comp of a first logic level. In addition, according to at least one example embodiment of the inventive concepts, when the on-time of the output clock signal CLK_o or the code-applied clock signal CLK_C is shorter than the off-time thereof, the comparator 1340 may output the comparison result RES_Comp of a second logic level. That is, according to at least one example embodiment of the inventive concepts, the comparator circuit 1300 may perform a function of indirectly comparing the duty of the code-applied clock signal CLK_C with 0.5 that is a target duty. The comparator 1340 may provide the comparison result RES_Comp to the duty error detection circuit 1400.

Figure 10:
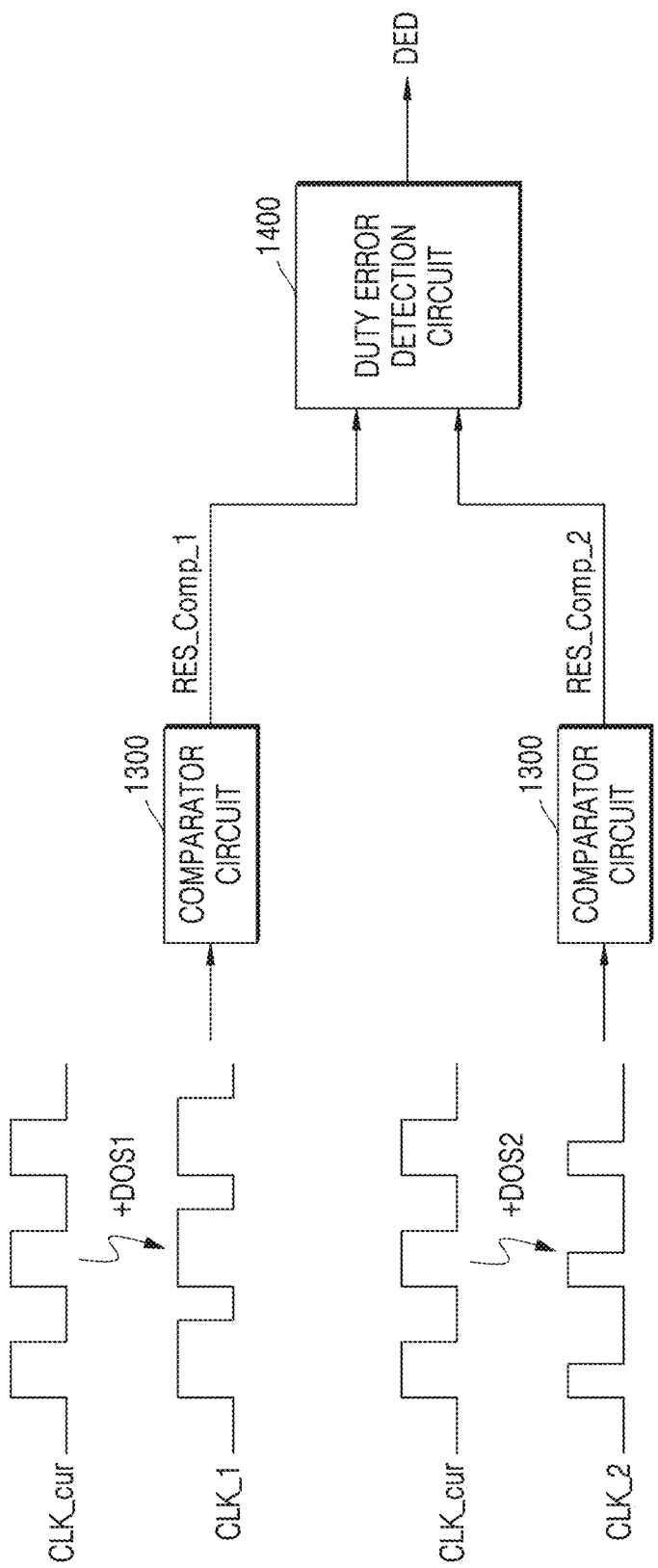
FIG. 10 illustrates a conceptual diagram of a situation of offset application in a duty cycle correction circuit, according to at least one example embodiment of the inventive concepts.

FIG. 10 illustrates a conceptual diagram of a situation of offset application in a duty cycle correction circuit, according to at least one example embodiment of the inventive concepts Descriptions regarding FIG. 10 will be made with reference to FIG. 8 together.

The duty cycle correction circuit 1000 may generate a first clock signal CLK_1 by applying, to the current clock signal CLK_cur, the first code to which the first duty offset DOS1 is applied. According to at least one example embodiment of the inventive concepts, the first duty offset DOS1 may have a positive offset value, and here, the first duty offset DOS1 may increase the duty of the clock signal.

The comparator circuit 1300 may generate the first comparison result RES_Comp_1 based on the first clock signal CLK_1. For example, the comparator circuit 1300 may generate the first comparison result RES_Comp_1 by comparing a duty of the first clock signal CLK_1 with the target duty.

The duty cycle correction circuit 1000 may generate a second clock signal CLK_2 by applying, to the current clock signal CLK_cur, the second code to which the second duty offset DOS2 is applied. According to at least one example embodiment of the inventive concepts, the second duty offset DOS2 may have a negative offset value, and here, the second duty offset DOS2 may decrease the duty of the clock signal.

The comparator circuit 1300 may generate the second comparison result RES_Comp_2 based on the second clock signal CLK_2. For example, the comparator circuit 1300 may generate the second comparison result RES_Comp_2 by comparing a duty of the second clock signal CLK_2 with the target duty.

The duty error detection circuit 1400 may generate the duty error detection signal DED based on the first comparison result RES_Comp_1 and the second comparison result RES_Comp_2.

Figure 11:
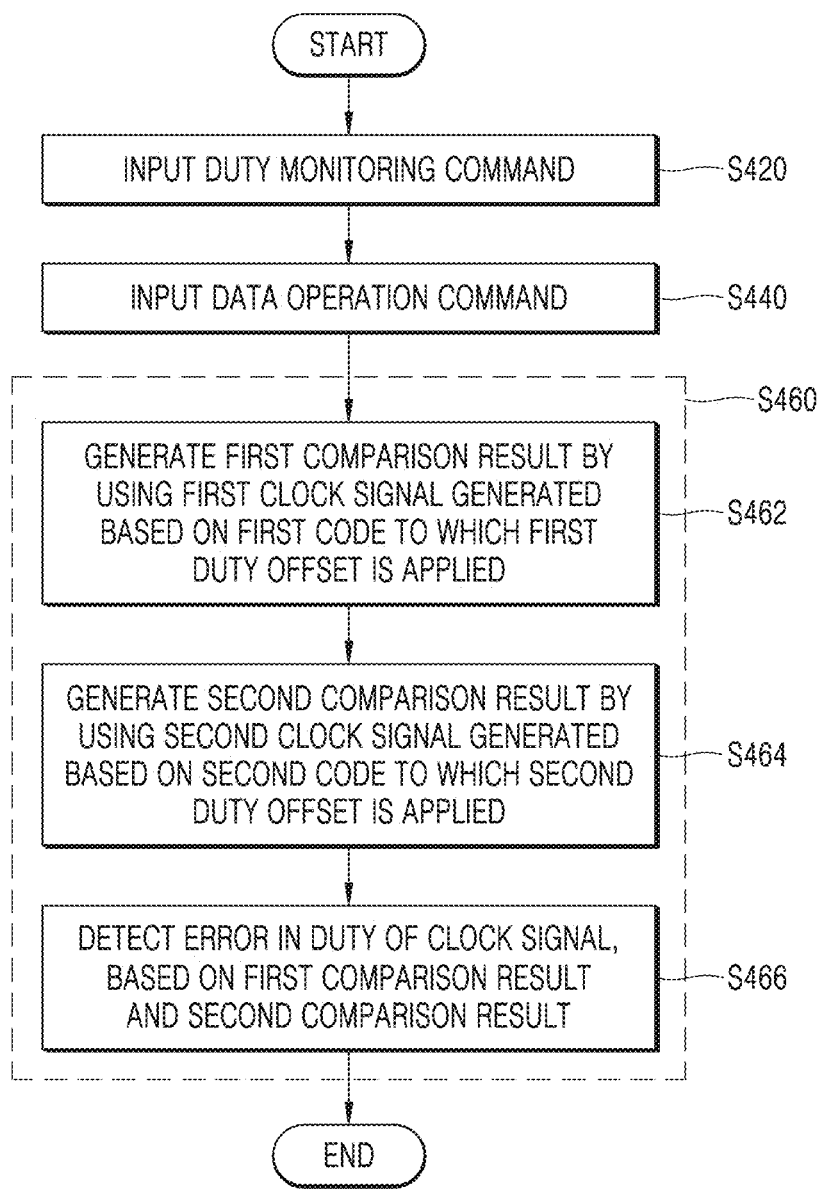
FIG. 11 illustrates a flowchart of a duty error detection method of a duty cycle correction circuit, according to at least one example embodiment of the inventive concepts.

FIG. 11 illustrates a flowchart of a duty error detection method of a duty cycle correction circuit, according to at least one example embodiment of the inventive concepts. In particular, FIG. 11 illustrates a flowchart when a duty cycle correction circuit is implemented inside a memory device. Descriptions regarding FIG. 11 will be made with reference to FIG. 8 together.

A duty monitoring command may be input to a memory device including the duty cycle correction circuit 1000 (S420). In other words, when the duty monitoring command is input to the memory device, the duty cycle correction circuit 1000 may monitor the duty of the clock signal as follows. However, operation S420 may be skipped According to at least some example embodiments of the inventive concepts and, for example, a duty monitoring operation may be performed in all data operations without the input of the duty monitoring command.

A data operation command may be input to the memory device including the duty cycle correction circuit 1000 (S440). The data operation command may include a data read command and a data write command. A data operation of the memory device according to the data operation command may include a latency interval. The latency interval may be differently determined according to specifications of the memory device.

According to at least one example embodiment of the inventive concepts, the duty cycle correction circuit 1000 may perform the duty monitoring operation as in operation S460, in the latency interval according to the data operation.

The duty cycle correction circuit 1000 may generate the first comparison result by using the first clock signal generated based on the first code to which the first duty offset DOS1 is applied (S462). For example, the code generation circuit 1100 may generate the first code to which the first duty offset DOS1 is applied, the duty adjustment circuit 1200 may generate the first clock signal by using the first code, and the comparator circuit 1300 may generate the first comparison result by comparing the duty of the first clock signal with the target duty.

The duty cycle correction circuit 1000 may generate the second comparison result by using the second clock signal generated based on the second code to which the second duty offset DOS2 is applied (S464). For example, the code generation circuit 1100 may generate the second code to which the second duty offset DOS2 is applied, the duty adjustment circuit 1200 may generate the second clock signal by using the second code, and the comparator circuit 1300 may generate the second comparison result by comparing the duty of the second clock signal with the target duty.

The duty cycle correction circuit 1000 may detect an error in the duty of the clock signal, based on the first comparison result and the second comparison result (S466). For example, the duty error detection circuit 1400 may detect an error in the duty of the clock signal by performing a logic operation by using the first comparison result and the second comparison result.

According to the duty cycle correction circuit 1000 according to at least one example embodiment of the inventive concepts, the duty monitoring operation may be performed in the latency interval related to the data operation. Therefore, because the duty may be monitored without the need of additional time, the consumption of additional time may be saved.

Figure 12:
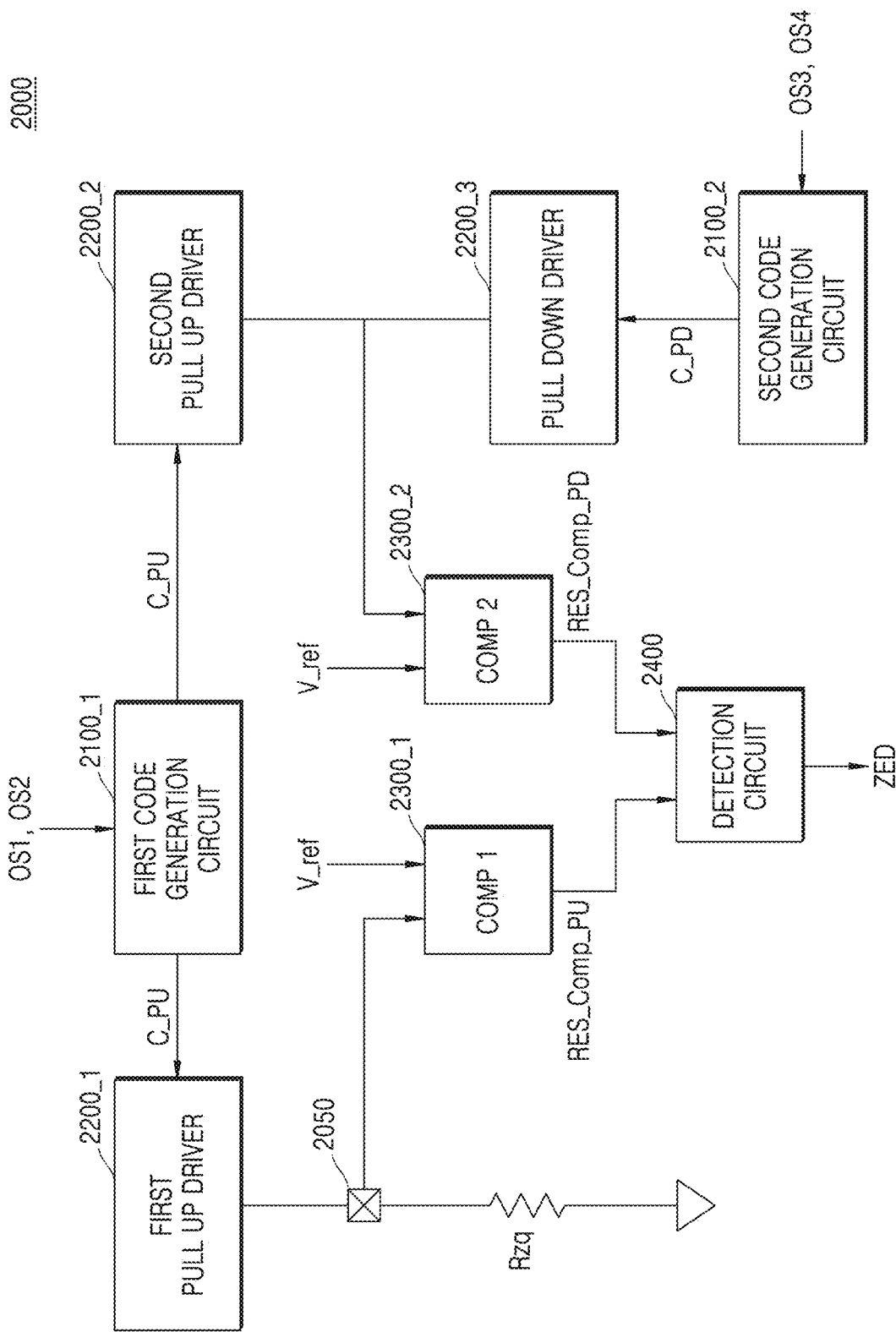
FIG. 12 illustrates an impedance calibration circuit according to at least one example embodiment of the inventive concepts.

FIG. 12 illustrates an impedance calibration circuit 2000 according to at least one example embodiment of the inventive concepts. The impedance calibration circuit 2000 may correspond to the parameter monitoring circuit 10 of FIG. 1. In other words, the embodiments described with reference to FIGS. 1 to 7 may also be equally applied to the impedance calibration circuit 2000.

The impedance calibration circuit 2000 may include a first code generation circuit 2100_1, a second code generation circuit 2100_2, a first pull-up driver 2200_1, a second pull-up driver 2200_2, a pull-down driver 2200_3, a first comparator circuit 2300_1, a second comparator circuit 2300_2, and a detection circuit 2400. The impedance calibration circuit 2000 may further include an impedance pin 2050, to which an external reference impedance Rzq is connected. The impedance pin 2050 may be connected to the first pull-up driver 2200_1.

The first code generation circuit 2100_1 may correspond to the code generation circuit 100 of FIG. 1. That is, the first code generation circuit 2100_1 may generate a pull-up code C_PU for adjusting impedance. The first code generation circuit 2100_1 may provide the pull-up code C_PU to the first pull-up driver 2200_1 and the second pull-up driver 2200_2. According to at least one example embodiment of the inventive concepts, in a first impedance monitoring mode, the first code generation circuit 2100_1 may generate a first pull-up code, to which the first offset OS1 is applied, and a second pull-up code, to which the second offset OS2 is applied. The first code generation circuit 2100_1 may provide the first pull-up code and the second pull-up code to the first pull-up driver 2200_1 and the second pull-up driver 2200_2. According to at least one example embodiment of the inventive concepts, the first offset OS1 may have a positive offset value, and the second offset OS2 may have a negative offset value. According to at least one example embodiment of the inventive concepts, an absolute value of the first offset OS1 may be equal to an absolute value of the second offset OS2.

The second code generation circuit 2100_2 may also correspond to the code generation circuit 100 of FIG. 1. That is, the second code generation circuit 2100_2 may generate a pull-down code C_PD for adjusting impedance. The second code generation circuit 2100_2 may provide the pull-down code C_PD to the pull-down driver 2200_3. According to at least one example embodiment of the inventive concepts, in a second impedance monitoring mode, the second code generation circuit 2100_2 may generate a third pull-down code, to which a third offset OS3 is applied, and a fourth pull-down code, to which a fourth offset OS4 is applied. The second code generation circuit 2100_2 may provide a third pull-up code and a fourth pull-up code to the pull-down driver 2200_3. According to at least one example embodiment of the inventive concepts, the third offset OS3 may have a positive offset value, and the fourth offset OS4 may have a negative offset value. According to at least one example embodiment of the inventive concepts, an absolute value of the third offset OS3 may be equal to an absolute value of the fourth offset OS4. According to at least one example embodiment of the inventive concepts, the third offset OS3 may have a value equal to that of the first offset OS1, and the fourth offset OS4 may have a value equal to that of the second offset OS2.

Each of the first pull-up driver 2200_1 and the second pull-up driver 2200_2 may correspond to the parameter adjustment circuit 200 of FIG. 1. Each of the first pull-up driver 2200_1 and the second pull-up driver 2200_2 may adjust an impedance value by using the pull-up code C_PU and may form an adjusted impedance value. According to at least one example embodiment of the inventive concepts, in the first impedance monitoring mode, each of the first pull-up driver 2200_1 and the second pull-up driver 2200_2 may have a first impedance value formed based on the first pull-up code, and then, may have a second impedance value formed based on the second pull-up code.

The pull-down driver 2200_3 may correspond to the parameter adjustment circuit 200 of FIG. 1. The pull-down driver 2200_3 may adjust an impedance value by using the pull-down code C_PD and may form an adjusted impedance value. According to at least one example embodiment of the inventive concepts, in the second impedance monitoring mode, the pull-down driver 2200_3 may have a third impedance value formed based on the first pull-down code, and then, may have a fourth impedance value formed based on the second pull-down code.

The first comparator circuit 2300_1 may correspond to the comparator circuit 300 of FIG. 1. The first comparator circuit 2300_1 may compare a voltage of the impedance pin 2050 with a reference voltage V_ref. According to at least one example embodiment of the inventive concepts, the reference voltage V_ref may be equal to a voltage value of the impedance pin 2050 when impedance formed by the first pull-up driver 2200_1 is consistent with target impedance. The first comparator circuit 2300_1 may output a result of the comparison as a pull-up comparison result RES_Comp_PU and, according to at least one example embodiment of the inventive concepts, may provide the pull-up comparison result RES_Comp_PU to the detection circuit 2400. According to at least one example embodiment of the inventive concepts, in the first impedance monitoring mode, the first comparator circuit 2300_1 may output a first pull-up comparison result by comparing the reference voltage V_ref with the voltage of the impedance pin 2050 due to the formation of the first impedance value by the first pull-up driver 2200_1, and may output a second pull-up comparison result by comparing the reference voltage V_ref with the voltage of the impedance pin 2050 due to the formation of the second impedance value by the second pull-up driver 2200_2.

The second comparator circuit 2300_2 may correspond to the comparator circuit 300 of FIG. 1. The second comparator circuit 2300_2 may compare the reference voltage V_ref with a voltage of a first node to which the second pull-up driver 2200_2 and the pull-down driver 2200_3 are connected in common. Although FIG. 12 illustrates that a reference voltage that is input to the second comparator circuit 2300_2 is equal to a reference voltage that is input to the first comparator circuit 2300_1, According to at least some example embodiments of the inventive concepts, different reference voltages may be respectively input to the first comparator circuit 2300_1 and the second comparator circuit 2300_2. The second comparator circuit 2300_2 may output a result of the comparison as a pull-down comparison result RES_Comp_PD and, according to at least one example embodiment of the inventive concepts, may provide the pull-down comparison result RES_Comp_PD to the detection circuit 2400. According to at least one example embodiment of the inventive concepts, in the second impedance monitoring mode, the second comparator circuit 2300_2 may output a first pull-down comparison result by comparing the reference voltage V_ref with the voltage of the first node due to the formation of the third impedance value by the pull-down driver 2200_3, and may output a second pull-down comparison result by comparing the reference voltage V_ref with the voltage of the first node due to the formation of the fourth impedance value by the pull-down driver 2200_3.

The detection circuit 2400 may correspond to the parameter error detection circuit 400 of FIG. 1. That is, the detection circuit 2400 may detect an impedance error in a pull-up stage by using the pull-up comparison result RES_Comp_PU provided from the first comparator circuit 2300_1, and may detect an impedance error in a pull-down stage by using the pull-down comparison result RES_Comp_PD provided from the second comparator circuit 2300_2. According to at least one example embodiment of the inventive concepts, in the first impedance monitoring mode, the detection circuit 2400 may output an impedance error detection signal ZED by using the first pull-up comparison result and the second pull-up comparison result. In addition, according to at least one example embodiment of the inventive concepts, in the second impedance monitoring mode, the detection circuit 2400 may output the impedance error detection signal ZED by using the first pull-down comparison result and the second pull-down comparison result. Here, the first impedance monitoring mode may refer to a mode for monitoring an error in the impedances of the first pull-up driver 2200_1 and the second pull-up driver 2200_2, and the second impedance monitoring mode may refer to a mode for monitoring an error in the impedance of the pull-down driver 2200_3. For this purpose, the detection circuit 2400 may be implemented as in FIG. 5.

According to the impedance calibration circuit 2000 according to at least one example embodiment of the inventive concepts, the impedance calibration circuit 2000 may sequentially generate the pull-up codes C_PU, to which the first offset OS1 and the second offset OS2 are respectively applied, in the first impedance monitoring mode, and may detect an error in the impedance of the pull-up stage based on the first pull-up comparison result and the second pull-up comparison due thereto. In addition, the impedance calibration circuit 2000 may sequentially generate the pull-down codes C_PD, to which the third offset OS3 and the fourth offset OS4 are respectively applied, in the second impedance monitoring mode, and may detect an error in the impedance of the pull-down stage based on the first pull-down comparison result and the second pull-down comparison due thereto. Thus, the impedance calibration circuit 2000 may detect or monitor an error in impedance without a separate monitoring device.

In particular, at least some selected from the first code generation circuit 2100_1, the second code generation circuit 2100_2, the first pull-up driver 2200_1, the pull-down driver 2200_3, the first comparator circuit 2300_1, and the second comparator circuit 2300_2 may be pre-provided hardware resources used for the purpose of impedance calibration in addition to the purpose of impedance monitoring, in the impedance calibration circuit 2000. Therefore, the impedance calibration circuit 2000 may also improve efficiency in hardware implementation by detecting an error in impedance by using the pre-provided hardware resources.

Figure 13:
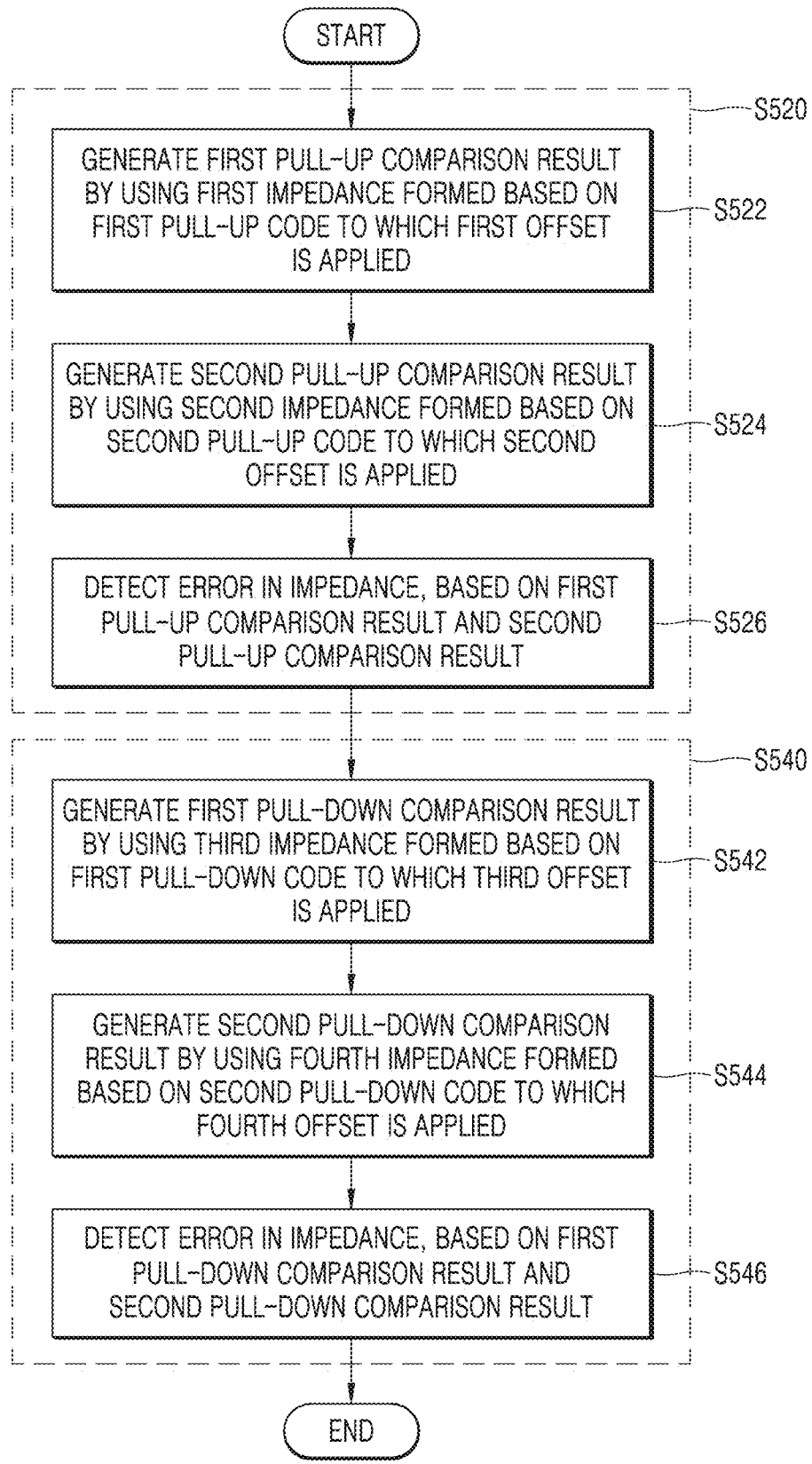
FIG. 13 illustrates a flowchart of an impedance error detection method of an impedance calibration circuit, according to at least one example embodiment of the inventive concepts.

FIG. 13 illustrates a flowchart of an impedance error detection method of an impedance calibration circuit, according to at least one example embodiment of the inventive concepts. Descriptions regarding FIG. 13 will be made with reference to FIG. 12 together.

According to at least one example embodiment of the inventive concepts, operation S520 may represent the first impedance monitoring mode, and operation S540 may represent the second impedance monitoring mode. Although FIG. 13 illustrates that operation S540 is performed after operation S520 is performed, at least some example embodiments of the inventive concepts are not limited thereto, and operation S520 may be performed after operation S540 is performed.

The impedance calibration circuit 2000 may generate the first pull-up comparison result by using the first impedance formed based on the first pull-up code to which the first offset OS1 is applied (S522). For example, the first code generation circuit 2100_1 may generate the first pull-up code to which the first offset OS1 is applied, the first pull-up driver 2200_1 may form the first impedance by using the first pull-up code, and the first comparator circuit 2300_1 may generate the first pull-up comparison result by comparing the reference voltage with the voltage of the impedance pin 2050 due to the formation of the first impedance.

The impedance calibration circuit 2000 may generate the second pull-up comparison result by using the second impedance formed based on the second pull-up code to which the second offset OS2 is applied (S524). For example, the first code generation circuit 2100_1 may generate the second pull-up code to which the second offset OS2 is applied, the first pull-up driver 2200_1 may form the second impedance by using the second pull-up code, and the first comparator circuit 2300_1 may generate the second pull-up comparison result by comparing the reference voltage with the voltage of the impedance pin 2050 due to the formation of the second impedance.

The impedance calibration circuit 2000 may detect an error in impedance based on the first pull-up comparison result and the second pull-up comparison result (S526). For example, the detection circuit 2400 may detect an error in impedance by performing a logic operation by using the first pull-up comparison result and the second pull-up comparison result. In particular, the impedance calibration circuit 2000 may detect an error in the pull-up stage.

The impedance calibration circuit 2000 may generate the first pull-down comparison result by using the third impedance formed based on the first pull-down code to which the third offset OS3 is applied (S542). For example, the second code generation circuit 2100_2 may generate the first pull-down code to which the third offset OS3 is applied, the pull-down driver 2200_3 may form the third impedance by using the first pull-down code, and the second comparator circuit 2300_2 may generate the first pull-down comparison result by comparing the reference voltage with the voltage of the first node due to the formation of the third impedance.

The impedance calibration circuit 2000 may generate the second pull-down comparison result by using the fourth impedance formed based on the second pull-down code to which the fourth offset OS4 is applied (S544). For example, the second code generation circuit 2100_2 may generate the second pull-down code to which the fourth offset OS4 is applied, the pull-down driver 2200_3 may form the fourth impedance by using the second pull-down code, and the second comparator circuit 2300_2 may generate the second pull-down comparison result by comparing the reference voltage with the voltage of the first node due to the formation of the fourth impedance.

The impedance calibration circuit 2000 may detect an error in impedance based on the first pull-down comparison result and the second pull-down comparison result (S546). For example, the detection circuit 2400 may detect an error in impedance by performing a logic operation by using the first pull-down comparison result and the second pull-down comparison result. In particular, the impedance calibration circuit 2000 may detect an error in the impedance of the pull-down stage.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A method of operating a system comprising a parameter monitoring circuit and a host, the method comprising:
   generating a first parameter applying a first code to a current parameter, wherein a first offset is applied to the first code;
   generating a first comparison result by comparing the first parameter with a reference parameter value;
   generating a second parameter applying a second code to the current parameter, wherein a second offset is applied to the second code;
   generating a second comparison result by comparing the second parameter with the reference parameter value;
   detecting an error in the current parameter, based on the first comparison result and the second comparison result; and
   providing a signal based on the error to the host.

2. The method of claim 1, wherein,
   the first offset has a positive value, and
   the second offset has a negative value.

3. The method of claim 2, wherein,
   the first offset and the second offset have the same magnitude.

4. The method of claim 1, wherein the detecting the error in the current parameter comprises:
   generating a parameter error detection signal based on the first comparison result and the second comparison result.

5. The method of claim 4, wherein the generating the parameter error detection signal comprises:
   performing an exclusive OR (XOR) operation by using the first comparison result and the second comparison result; and
   generating a result value of the XOR operation as the parameter error detection signal.

6. The method of claim 5, wherein the providing the signal based on the error to the host comprises:
   outputting, to the host outside the parameter monitoring circuit, the parameter error detection signal as an error correction directing signal for directing an operation of correcting the error in the current parameter.

7. The method of claim 6, further comprising:
   performing, by the host, retraining of a code on the current parameter in response to receiving the error correction directing signal.

8. The method of claim 1, further comprising:
   receiving, by the parameter monitoring circuit, a parameter monitoring command from the host.

9. The method of claim 1, further comprising:
   detecting the error in the current parameter by using a first offset level, wherein the first offset has a positive first offset level and the second offset has a negative first offset level; and
   determining that the current parameter is in an error situation, when the error in the current parameter is detected.

10. The method of claim 9, further comprising:
    detecting the error in the current parameter by using a second offset level, when the error in the current parameter by using the first offset level is not detected, wherein the first offset has a positive second offset level and the second offset has a negative second offset level;
    determining that the current parameter is in the error situation, when the error in the current parameter is detected; and
    determine that the current parameter is in a normal situation, when the error in the current parameter is not detected.

11. The method of claim 10, wherein the second offset level is less than that of the first offset level.

12. An impedance calibration circuit comprising:
a first code generation circuit configured to generate a first pull-up code, to which a first offset is applied, and a second pull-up code, to which a second offset is applied;
a first pull-up driver configured to form a first impedance by using the first pull-up code and form a second impedance by using the second pull-up code;
an impedance pin connected to the first pull-up driver and connected to an external impedance;
a first comparator circuit configured to generate a pull-up comparison result based on a voltage of the impedance pin with a reference voltage value; and
an impedance error detection circuit configured to detect an impedance error based on a first pull-up comparison result and a second pull-up comparison result, the first pull-up comparison result being based on the first impedance by the first pull-up driver, and the second pull-up comparison result being based on the second impedance by the first pull-up driver.

13. The impedance calibration circuit of claim 12, wherein,
the first offset has a positive value, and
the second offset has a negative value.

14. The impedance calibration circuit of claim 12, wherein the first offset and the second offset have the same absolute value.

15. The impedance calibration circuit of claim 12, further comprising:
a second code generation circuit configured to generate a first pull-down code, to which a third offset is applied, and a second pull-down code, to which a fourth offset is applied;
a pull-down driver configured to form a third impedance by using the first pull-down code and form a fourth impedance by using the second pull-down code;
a second pull-up driver configured to form a pull-up impedance based on a pull-up code generated by the first code generation circuit; and
a second comparator circuit configured to generate a pull-down comparison result by comparing the reference voltage value with a voltage of a node to which the pull-down driver and the second pull-up driver are connected in common,
wherein the impedance error detection circuit is further configured to detect an impedance error based on a first pull-down comparison result and a second pull-down comparison result, the first pull-down comparison result is based on the third impedance by the pull-down driver, and the second pull-down comparison result being is on the fourth impedance by the pull-down driver.

16. A method of operating a system comprising an impedance calibration circuit and a host, the method comprising:
generating a first pull-up comparison result by using a first impedance formed based on a first pull-up code, to which a first offset is applied;
generating a second pull-up comparison result by using a second impedance formed based on a second pull-up code, to which a second offset is applied;
detecting an error in a current impedance based on the first pull-up comparison result and the second pull-up comparison result; and
providing a signal based on the error to the host.

17. The method of claim 16, further comprising:
generating a first pull-down comparison result by using a third impedance formed based on a first pull-down code, to which a third offset is applied;
generating a second pull-down comparison result by using a fourth impedance formed based on a second pull-down code, to which a fourth offset is applied; and
detecting the error in the current impedance based on the first pull-down comparison result and the second pull-down comparison result.

18. The method of claim 16, wherein the generating the first pull-up comparison result comprises:
generating the first pull-up code, to which the first offset is applied;
forming the first impedance by using the first pull-up code; and
generating the first pull-up comparison result by comparing a reference voltage with a voltage of an impedance pin based on a formation of the first impedance.

19. The method of claim 16, wherein the generating the second pull-up comparison result comprises:
generating the second pull-up code, to which the second offset is applied;
forming the second impedance by using the second pull-up code; and
generating the second pull-up comparison result by comparing a reference voltage with a voltage of an impedance pin based on a formation of the second impedance.

20. The method of claim 16, wherein the detecting the error in the current impedance comprises:
performing a logic operation by using the first pull-up comparison result and the second pull-up comparison result.

* * * * *